United States Patent
Khang et al.

(10) Patent No.: US 7,572,662 B2
(45) Date of Patent: Aug. 11, 2009

(54) METHOD OF FABRICATING PHASE CHANGE RAM INCLUDING A FULLERENE LAYER

(75) Inventors: Yoon-ho Khang, Yongin-si (KR); Sang-Mock Lee, Yongin-si (KR); Jin-seo Noh, Seoul (KR); Woong-Chul Shin, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 40 days.

(21) Appl. No.: 11/604,824

(22) Filed: Nov. 28, 2006

(65) Prior Publication Data
US 2007/0152754 A1   Jul. 5, 2007

(30) Foreign Application Priority Data
Jan. 3, 2006   (KR) ............... 10-2006-0000472

(51) Int. Cl.
*H01L 21/00* (2006.01)
*H01L 21/06* (2006.01)
*H01L 21/4763* (2006.01)
*H01L 21/44* (2006.01)

(52) U.S. Cl. ............... 438/54; 438/102; 438/642; 438/645; 438/665; 977/734; 257/E51.039; 257/E45.002

(58) Field of Classification Search ............... 438/48, 438/54, 102, 642, 645, 665; 977/734
See application file for complete search history.

(56) References Cited

U.S. PATENT DOCUMENTS

| | | | |
|---|---|---|---|
| 2006/0157771 A1* | 7/2006 | Choi et al. | 257/306 |
| 2007/0025138 A1* | 2/2007 | Furukawa et al. | 365/151 |
| 2007/0051935 A1* | 3/2007 | Lee et al. | 257/1 |

OTHER PUBLICATIONS

Fullerene, Dictionary reference, Academic Press Dictionary of Science and Technology, 1992, Oxford: Elsevier Science and Technology.*

* cited by examiner

*Primary Examiner*—Hsien-ming Lee
*Assistant Examiner*—Kevin A Parendo
(74) *Attorney, Agent, or Firm*—Harness, Dickey & Pierce, P.L.C.

(57) ABSTRACT

A method of fabricating a phase change RAM (PRAM) having a fullerene layer is provided. The method of fabricating the PRAM may include forming a bottom electrode, forming an interlayer dielectric film covering the bottom electrode, and forming a bottom electrode contact hole exposing a portion of the bottom electrode in the interlayer dielectric film, forming a bottom electrode contact plug by filling the bottom electrode contact hole with a plug material, forming a fullerene layer on a region including at least an upper surface of the bottom electrode contact plug and sequentially stacking a phase change layer and an upper electrode on the fullerene layer. The method may further include forming a switching device on a substrate and a bottom electrode connected to the switching device, forming an interlayer dielectric film covering the bottom electrode and forming a bottom electrode contact hole exposing a portion of the bottom electrode in the interlayer dielectric film.

23 Claims, 7 Drawing Sheets

METHOD OF FABRICATING PHASE CHANGE RAM INCLUDING A FULLERENE LAYER

PRIORITY STATEMENT

This application claims priority under 35 U.S.C. § 119 to Korean Patent Application No. 10-2006-0000472, filed on Jan. 3, 2006, in the Korean Intellectual Property Office (KIPO), the entire contents of which are incorporated herein reference.

BACKGROUND

1. Field

Example embodiments relate to a method of fabricating a phase change RAM (PRAM) having a fullerene layer between a bottom electrode and a phase change layer.

2. Description of the Related Art

A phase change layer recording data in a phase change RAM (PRAM) may be in a crystal state and/or an amorphous state in accordance with a heating temperature and a cooling speed. When the phase change layer is in a crystal state, the resistance of a storage node may be relatively low, and when the phase change layer is in an amorphous state, the resistance of a storage node may be relatively high. The PRAM may be a non-volatile memory device recording and reading data, based on a resistance of current passing the phase change layer. The resistance of current passing the phase change layer may differ depending on whether the phase change layer of the PRAM may be in a crystal state and/or in an amorphous state.

In regards to PRAM, a reset current (Ireset) used to create a phase change layer with an amorphous structure may be relatively high. In order to increase an integration density of a typical PRAM, in which one cell may be composed of a storage node including one phase change layer and one transistor, sizes of the storage node and the transistor may be respectively reduced. When the size of the transistor is reduced, a maximum current of the transistor may decrease. When a reset current is higher than the maximum current of the transistor, data storage using the phase change and an increase in integration density of the PRAM may be relatively difficult unless the reset current of the PRAM is decreased.

SUMMARY

Example embodiments provide a method of fabricating a phase change RAM (PRAM) having a fullerene layer between a bottom electrode and a phase change layer. Example embodiments also provide a method of fabricating a PRAM capable of improving electrical characteristics of the PRAM, by improving an alignment state of the fullerene layer.

According to example embodiments, a method of fabricating a PRAM may include forming a bottom electrode, forming an interlayer dielectric film covering the bottom electrode, and forming a bottom electrode contact hole exposing a portion of the bottom electrode in the interlayer dielectric film, forming a bottom electrode contact plug by filling the bottom electrode contact hole with a plug material, forming a fullerene layer on a region including at least an upper surface of the bottom electrode contact plug and sequentially stacking a phase change layer and an upper electrode on the fullerene layer. The method may further include forming a switching device on a substrate and a bottom electrode connected to the switching device, forming an interlayer dielectric film covering the bottom electrode and forming a bottom electrode contact hole exposing a portion of the bottom electrode in the interlayer dielectric film.

A fullerene forming the fullerene layer may be at least one selected from the group including $C_{60}$, $C_{70}$, $C_{76}$, $C_{78}$, $C_{82}$ and $C_{84}$. A fullerene forming the fullerene layer may be a metal endohedral including a metal atom therein. The metal atom may be from the lanthanide group of a metal atom including La, Er, Gd, Ho and Nd. In the forming of the fullerene layer, the fullerene layer may be formed to a thickness of a monolayer to about 100 layers, for example, a monolayer to about 10 layers.

According to example embodiments, in the forming of the bottom electrode contact plug and in the forming of the fullerene layer, the plug material may be filled so that an upper surface of the bottom electrode contact plug and an upper surface of the interlayer dielectric film may be planarized, and the fullerene layer may be formed thereon. Alternatively, the plug material may be filled so that a height of the bottom electrode contact plug may be lower than an upper surface of the interlayer dielectric film, and the fullerene layer may be formed in a remaining portion of the contact hole.

According to example embodiments, in the forming of the fullerene layer, the fullerene layer may be formed, using a vacuum deposition method. As one example, a vacuum deposition method by sublimation may be used. While performing the vacuum deposition method, the substrate on which the fullerene layer is deposited may be heated, and a heating temperature of the substrate may be in a range of about 100° C. to about 400° C. According to example embodiments, in the forming of the fullerene layer, the fullerene layer may be formed by performing a coating method using a solution including fullerenes. As one example, a spin coating method may be used. A solvent of the solution including fullerenes may use toluene.

After forming the fullerene layer and before forming the phase change layer, the substrate having the fullerene layer formed thereon may be annealed. A temperature of the annealing may be in a range of about 100° C. to about 350° C. The annealing may be performed in an atmosphere of a vacuum, inert gas, or nitrogen gas, and the annealing may be performed in an atmosphere, to which $H_2$ or $NH_3$ gas may be further added.

BRIEF DESCRIPTION OF THE DRAWINGS

Example embodiments will be more clearly understood from the following detailed description taken in conjunction with the accompanying drawings. FIGS. 1-7 represent non-limiting, example embodiments as described herein.

FIG. 1 is a diagram illustrating a phase change RAM (PRAM) according to example embodiments;

FIG. 2 is a diagram illustrating a bottom electrode contact plug, a fullerene layer and a phase change layer of FIG. 1;

FIG. 3 is a diagram illustrating the structure of a PRAM according to example embodiments;

FIG. 4 illustrates a change of resistance in accordance with an applied current when the phase change layer 61 of the PRAM shown in FIG. 1 is in a crystal state and an amorphous state respectively;

FIG. 5 illustrates resistance variance patterns when a reset current and a set current are repeatedly applied in a same pattern to the PRAM according to FIG. 1;

FIG. 7 illustrates plots of electrical characteristics of the PRAM in accordance with the annealing process after the fullerene layer is formed.

DETAILED DESCRIPTION OF EXAMPLE EMBODIMENTS

Figure 1:
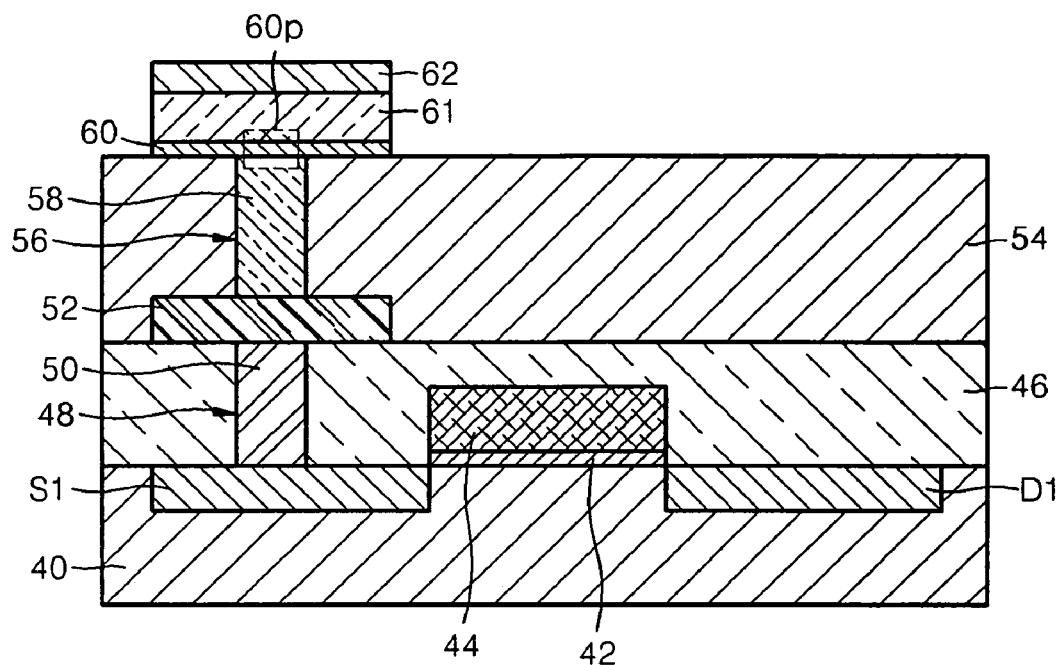

Hereinafter, methods of fabricating a phase change RAM (PRAM) having a fullerene layer according to example embodiments will be explained in detail with reference to the accompanying drawings, after a description is given of structural characteristics and advantages of the PRAM having a fullerene layer. In the drawings, the thickness of layers and regions are exaggerated for clarity.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90° or at other orientations) and the spatially relative descriptors used herein interpreted accordingly.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

First, a phase change RAM according to example embodiments will be explained. FIG. 1 illustrates the structure of the PRAM. Referring to FIG. 1, first and second impurity regions S1 and D1, doped with conductive impurities (e.g., n-type impurities), may be disposed in a substrate 40 of the first PRAM and separated by a desired distance. The substrate 40 may be, for example, a p-type silicon substrate. The first and second impurity regions S1 and D1 may have various shapes. One of the first and second impurity regions S1 and D1, for example, the first impurity region S1, may be a source region, and the other impurity region may be a drain region. A gate oxide layer 42 may be disposed on the substrate 40 between the first and second impurity regions S1 and D1 and a gate 44 may be disposed on the gate oxide layer 42. The substrate 40, the first and second impurity regions S1 and D1, and the gate 44 may form a field effect transistor. The field effect transistor may be replaced with a PN-junction diode.

A first interlayer dielectric film 46 may be formed on the substrate 40, to cover the transistor. A contact hole 48 exposing the first impurity region S1 may be formed in the first interlayer dielectric film 46. The contact hole 48 may be formed at the position exposing the second impurity region D1 instead of the first impurity region S1. The contact hole 48 may be filled with a conductive plug 50. A bottom electrode 52 may be disposed on the first interlayer dielectric film 46 covering the exposed upper surface of the conductive plug 50. The bottom electrode 52 may also function as a pad layer. A second interlayer dielectric film 54 covering the bottom electrode 52 may be disposed on the first interlayer dielectric film 46. A bottom electrode contact hole 56, exposing a partial upper surface of the bottom electrode 52, may be formed in the second interlayer dielectric film 54. The second interlayer dielectric film 54 may be formed of the same material as that of the first interlayer dielectric film 46. The bottom electrode contact hole 56 may be filled with a plug material, so that a bottom electrode contact plug 58 may be formed.

A fullerene layer 60, covering an upper surface of the bottom electrode contact plug 58, may be disposed on the second interlayer dielectric film 54. A phase change layer 61 and an upper electrode 62 may be sequentially stacked on the fullerene layer 60. The fullerene layer 60 may be composed of one kind of fullerene molecules, or may be formed of a plurality of layers composed of different kinds of fullerene molecules. The phase change layer 61 may be, for example, a germanium antimony tellurium (hereinafter, GST) layer. The bottom electrode 52, the bottom electrode contact plug 58, the fullerene layer 60, the phase change layer 61 and the upper electrode 62 may form a storage node storing bit data. When the bottom electrode 52 directly contacts the fullerene layer 60, the bottom electrode contact plug 58 in the storage node may be omitted.

Figure 2:
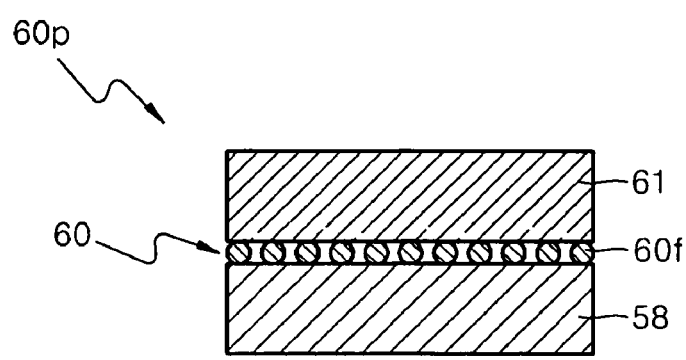

FIG. 2 is a diagram illustrating a portion 60p including the bottom electrode contact plug 58, the fullerene layer 60 and the phase change layer 61 of FIG. 1. Referring to FIG. 2, the fullerene layer 60 may be, for example, a monolayer. The fullerene layer 60 including a plurality of fullerenes 60f may be formed of a monolayer (a single layer) as above and/or may be formed of one single layer to about one hundred layers.

A resistance when a current passes through the fullerene layer may be relatively high compared to a resistance without the fullerene layer. Because a relatively small region having a relatively high resistance causes an increase of joule heat in the region, the joule heat generated between the phase change layer 61 and the bottom electrode contact plug 58 may further increase compared to that of the case without the presence of the fullerene layer 60. Because thermal conductivity of the fullerene layer is relatively low, the loss of generated heat may be decreased or minimized.

When a current I is a reset current (Ireset), and although the reset current is further lowered compared to the reset current in a conventional device, joule heat may be generated between the bottom electrode contact plug 58 and the phase change layer 61. A temperature of the portion of the phase change layer 61 in contact with the fullerene layer 60 may increase to its phase change temperature (e.g., melting point or higher) so that the portion of the phase change layer 61 may be in an amorphous state. As described above, the fullerene layer 60 may function at relatively high efficiency even with heat generated to increase the value of heat generated and reduce heat loss.

Figure 3:
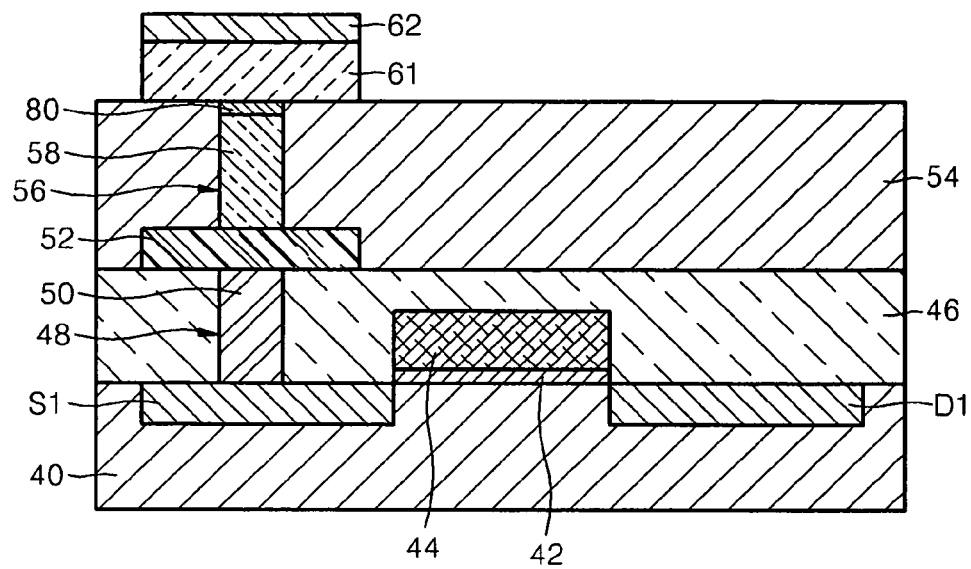

FIG. 3 illustrates the structure of a PRAM according to example embodiments. Referring to FIG. 3, a bottom electrode contact plug 58 may be disposed lower than an upper surface of a second interlayer dielectric film 54 by a desired thickness. As a result, an upper portion of a bottom electrode contact hole 56 may have empty space at a desired thickness. The empty space of the bottom electrode contact hole 56 may be filled with a fullerene layer 80. A phase change layer 61 may be formed on the second interlayer dielectric film 54 covering an upper surface of the fullerene layer 80. The material and layer structure of the fullerene layer 80 may be same as those of the fullerene layer 60.

Figure 4:
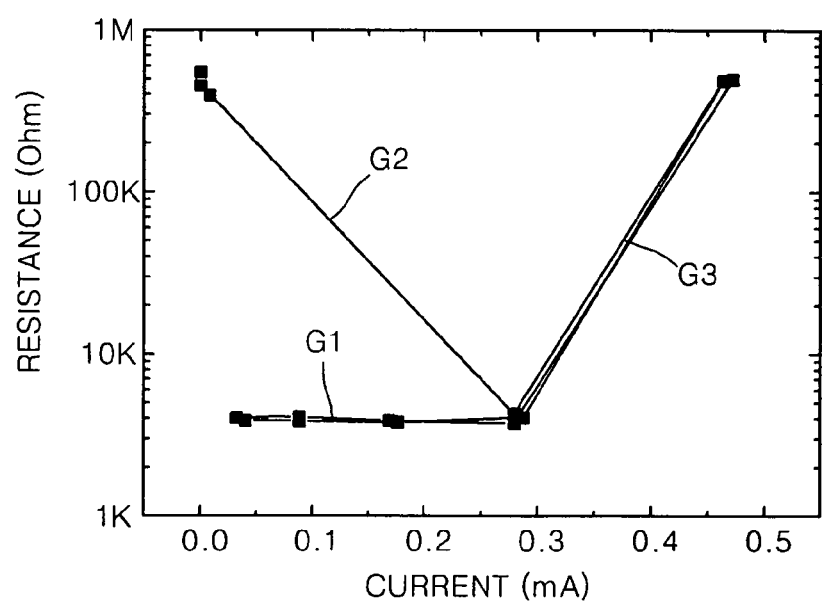

FIG. 4 illustrates a change of resistance in accordance with an applied current when the phase change layer 61 of the PRAM in FIG. 1 may be in a crystal state and an amorphous state, respectively. In FIG. 4, a first plot G1 and a third plot G3 illustrate resistance-current characteristics when the phase change layer 61 of the PRAM may be initially in a crystal state. A second plot G2 illustrates resistance-current characteristics when the phase change layer 61 of the PRAM may be initially in an amorphous state. Each plot G1, G2, and G3 may be made by applying current pulses corresponding to values shown on the horizontal axis of FIG. 4. The current pulses may be in the crystal state and/or the amorphous state and the resistance for each current pulse may be measured. The measured resistance may be indicated as a value of a vertical axis.

In the first and third plots G1 and G3, when the phase change layer 61 is initially in a crystal state, the resistance may be relatively low and may not change until an applied current reaches about 0.3 mA. When the current is about 0.5 mA, the resistance of the PRAM may increase. Therefore, phase change may occur in the phase change layer of the PRAM, which is changed from a crystal state to an amorphous state, when a current pulse of about 0.4 mA is applied. A reset current may be about 0.4 mA.

Referring to the second plot G2, a resistance of the PRAM having a relatively high resistance at the initial amorphous state may be gradually decreased, while a current pulse is applied. As the phase change layer 61 during the initial amorphous state changes to a crystal state when a current pulse of about 0.3 mA is applied, a resistance of the phase change layer 61 may become equal to the resistance at the initial crystal state. When the applied current is increased to about 0.3 mA or higher, the phase change layer 61, which has been changed from the amorphous state to the crystal state, may be changed again to the amorphous state so that its resistance may again increase.

Figure 5:
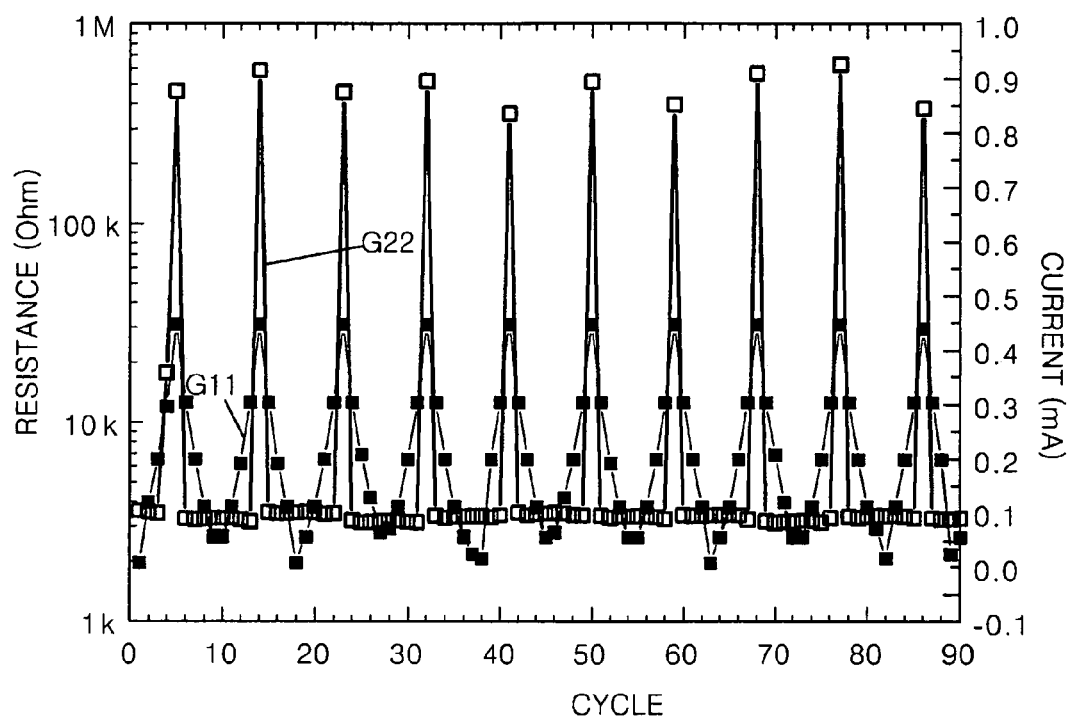

FIG. 5 illustrates resistance variance patterns when a reset current and a set current may be repeatedly applied in a same pattern to the PRAM illustrated in FIG. 1. FIG. 5 illustrates resistance variance patterns of the PRAM when current pulses may be applied to the first PRAM ten times in a same pattern of application. In FIG. 5, a first plot G1 may represent a current applied to the PRAM, and a second plot G22 may represent a resistance of the PRAM measured after the current is applied.

Referring to the first and second plots G11 and G22 of FIG. 5, a current may be repeatedly applied in accordance with a desired pattern of application (hereinafter, current application pattern), and a resistance of the PRAM measured according thereto also may have a repeated pattern (hereinafter, resistance pattern). As a result, the resistance patterns may be the same and a cycle of the resistance pattern may correspond to a cycle of the current application pattern. Because reduced resistance values in the resistance patterns have almost the same values, and increased resistance values in the resistance patterns also have almost the same values, the resistance patterns may have little deviation. The results show that increased resistance values and decreased resistance values, measured many times under the same conditions with respect to PRAM, may be constant within permissible limits and differences between the increased resistance values and the reduced resistance values may be constant within permissible limits. The results verify that reproducibility of the PRAM may be improved.

Figure 6A:
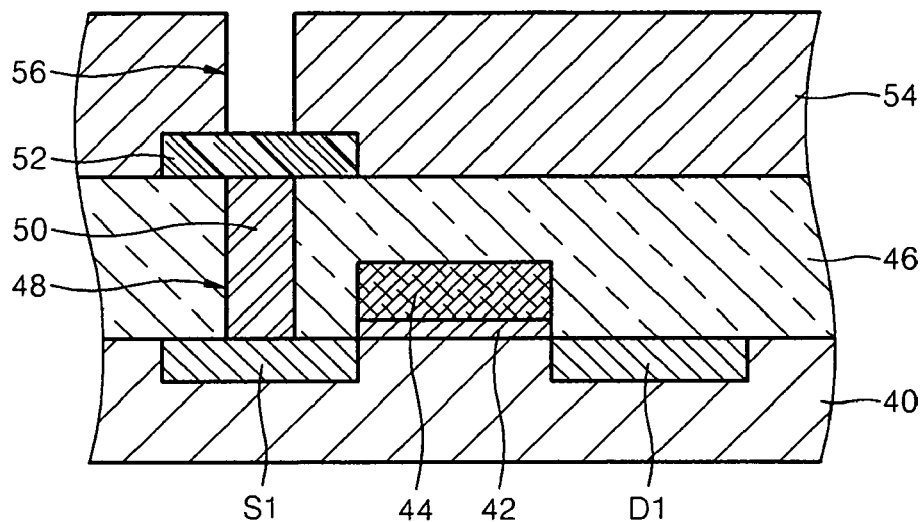
FIGS. 6A-6F illustrate processes of fabricating the PRAM shown in FIG. 1.

Hereinafter, a method of fabricating a PRAM having a fullerene layer as described above will be explained. FIGS. 6A through 6F illustrate processes of fabricating the PRAM shown in FIG. 1. As shown in FIG. 6A, a switching device (for example, a field effect transistor including a source region S1 and a drain region D1, and a gate 44) may be formed on a substrate 40. A bottom electrode 52 may be formed on a first interlayer dielectric film 46 covering the switching device, to be connected to the switching device. A second interlayer dielectric film 54 may be formed to cover the bottom electrode 52. A bottom electrode contact hole 56 exposing a portion of the bottom electrode 52 may be disposed in the second interlayer dielectric film 54. Normal fabrication processes may be employed to achieve the above structure.

Figure 6B:
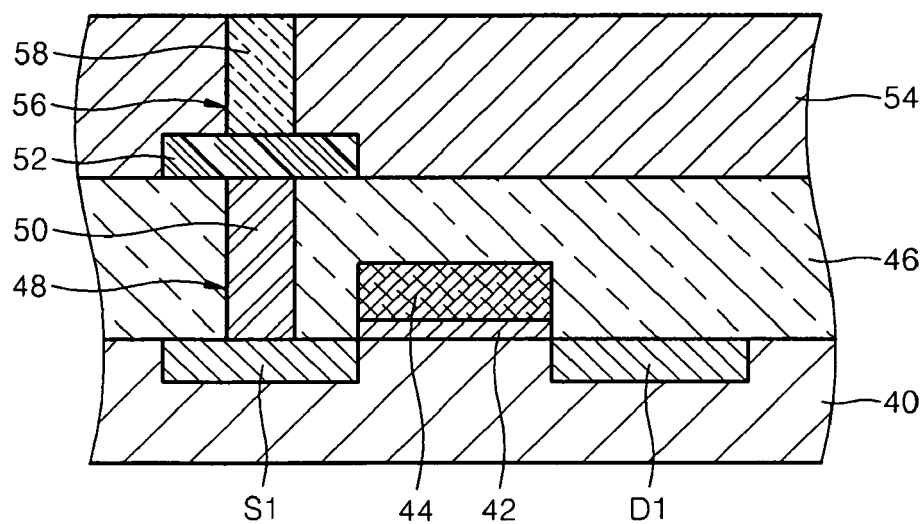

As shown in FIG. 6B, the bottom electrode contact hole 56 may be filled with a plug material, so as to form a bottom electrode contact plug 58. The plug material to form the bottom electrode contact plug 58 may be TiN and/or TiAlN. The plug materials listed as above may be just examples, and example embodiments may not be limited thereto.

The bottom electrode contact plug 58 may be formed to a height that may be even with the upper surface of the second interlayer dielectric film 54 shown in the PRAM according to FIG. 1 described above, or alternatively, may be formed to a height lower than the upper surface of the second interlayer dielectric film 54 by a desired thickness like the PRAM according to FIG. 3. According to the PRAM in FIG. 3, a fullerene layer may be formed in a remaining portion of the bottom electrode contact hole 56.

Figure 6C:
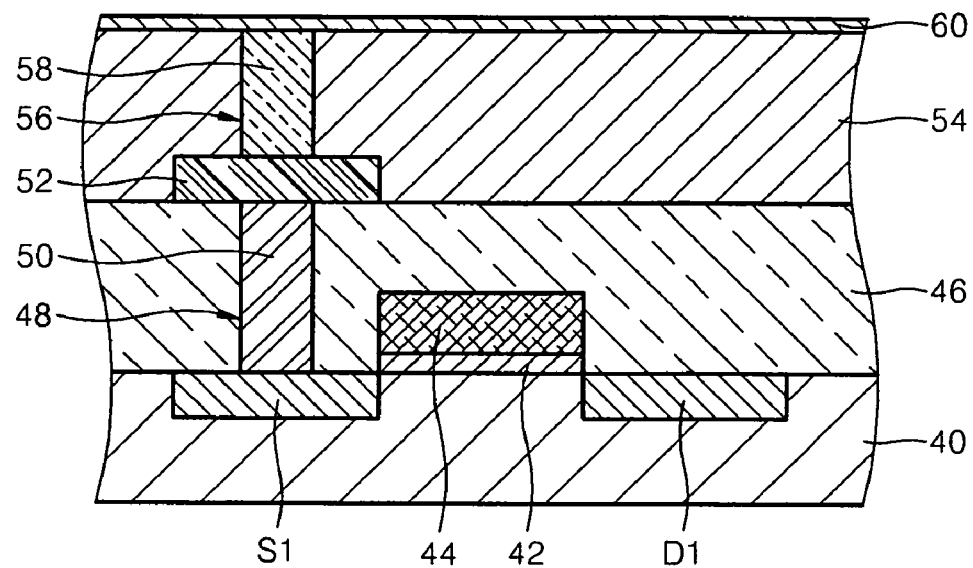

As shown in FIG. 6C, a fullerene layer 60 may be formed on the second interlayer dielectric film 54 covering the bottom electrode contact plug 58. The fullerene used to form the fullerene layer 60 may be any one of $C_{60}$, $C_{70}$, $C_{76}$, $C_{78}$, $C_{82}$ and/or $C_{84}$. The fullerene may be a metal endohedral including metal atoms therein. The metal atom may be from a lanthanide group including La, Er, Gd, Ho and/or Nd.

The fullerene layer 60 may be formed to a thickness of one layer as a monolayer to about one hundred layers. If the thickness of the fullerene layer 60 is undesirably thick, the joule heat generated from the fullerene layer 60 may not be transferred to the phase change layer effectively. The fullerene layer may be formed to a thickness of one monolayer to about ten monolayers.

A plurality of fullerene layers may be formed, using different kinds of fullerenes, so as to form a stack structure. A resistance to the current passing through the fullerene layer 60 may increase further when compared with the fullerene layer 60 formed of one monolayer as in the PRAM of FIG. 1. A value of heat generated may also increase further than that of the fullerene layer 60 in the PRAM of FIG. 1. A reset current may be reduced further by forming a plurality of fullerene layers as described above. In an experiment performed using example embodiments, a reset current may be about 0.4 mA in the PRAM with a fullerene layer 60 formed of one monolayer, but a reset current may be about 0.26 mA in a PRAM having a plurality of fullerene layers 60.

The fullerene layer 60 may be formed employing various methods, for example, a vacuum deposition method, and may be performed using typical vacuum deposition equipment. Effusion cells, including plural fullerenes inside a vacuum chamber, may be heated. In one example, an inner pressure of the chamber may be about $1.0 \times 10^{-7}$ Torr or less, a heating temperature may be in a range of about 450° C. to about 500°

C. and a deposition time may be about 10 minutes to about 60 minutes. The conditions may be varied depending on the kinds of fullerenes and the equipment used to form the fullerene layers, but the scope may not be limited thereto. Fullerene molecules, sublimated from the effusion cells, may be deposited on the substrate, for example, on the region including the upper surface of the bottom electrode contact plug 58.

In the meantime, the thickness of the fullerene layer 60 may be controlled in accordance with a heating temperature of the effusion cells and a time taken to perform the vacuum deposition. Under the desired conditions, the fullerene layer 60 may be formed at a rate of about one monolayer every 10 minutes. The thickness of the fullerene layer 60 formed as described above may be in a range of one monolayer to about 100 monolayers, for example, in a range of one monolayer to about 10 monolayers.

The substrate may be heated while the vacuum deposition is performed with respect to the fullerene layer 60. The substrate may be a plate-shaped structure for thin films to be formed on and may include the structure shown in FIG. 6B and the fullerene layer 60 to be formed thereon. The heating temperature of the substrate may be in a range of about 100° C. to about 400° C. The heating of the substrate may improve an alignment state of the deposited fullerene molecules of the fullerene layer 60.

The substrate, having the deposited fullerene layer 60, may be annealed. A temperature for the annealing may be in a range of about 100° C. to about 350° C. The alignment state of the fullerene molecules may be improved due to the annealing process, and electrical characteristics of the PRAM may be improved. The annealing process may be performed in an atmosphere of a vacuum, inert gas or $N_2$ gas, and hydrogen gas ($H_2$) or ammonia gas ($NH_3$) may be added to the atmosphere. The annealing process may be performed under these conditions to reduce deformation and/or modification of the substrate, and to exclude an unnecessary chemical reaction with foreign materials on the surface of the substrate.

As another example, the fullerene layer 60 may be formed using a solution coating method. The solution coating method may include covering the substrate surface using a solution having fullerene molecules dispersed in a solvent, and evaporating the solvent to form the fullerene coating layer. The solution coating method may include various thin film coating processes (e.g., spin coating, dipping and/or any other process). The following may be one example of the formation of the fullerene layer 60 using a spin coating process.

A solution at a concentration of about 0.01 mM/L to about 0.2 mM/L may be prepared by dispersing fullerene molecules in a toluene solvent. Spin coating may be performed on the upper surface of the substrate (as in the structure of FIG. 6B), using the prepared solution, so as to evaporate the solvent. A thickness of the fullerene layer 60 may be controlled by the concentration of the solution. The thickness of the fullerene layer 60 formed as described above may be in a range of one monolayer to about 100 monolayers, for example, in a range of one monolayer to about 10 monolayers. The solvent dispersing the fullerene molecules may use various materials, and may be any one selected from the group consisting of 1,2,4-trichlorobenzene, carbon disulfide, toluene, benzene, chloroform, carbon tetrachloride, cyclohexane, n-hexane, THF, acetonitrile and/or methanol. After the spin coating process is performed on the fullerene layer 60, the substrate having the fullerene layer 60 formed thereon may also be annealed as in the vacuum deposition process. Specific conditions for the annealing process (e.g., an annealing temperature and/or atmosphere conditions) may be the same as described above.

Figure 6D:
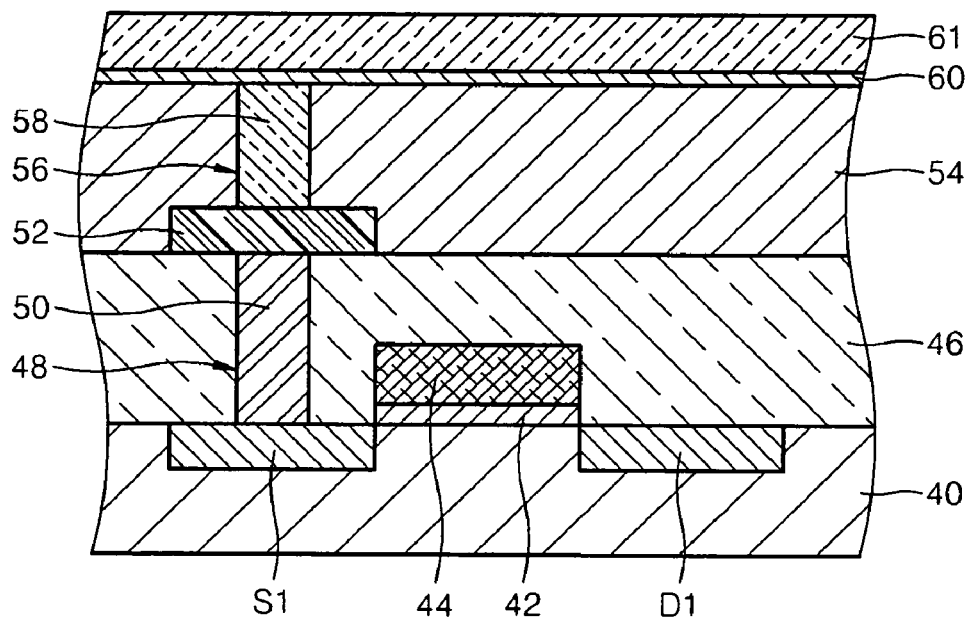
Figure 6E:
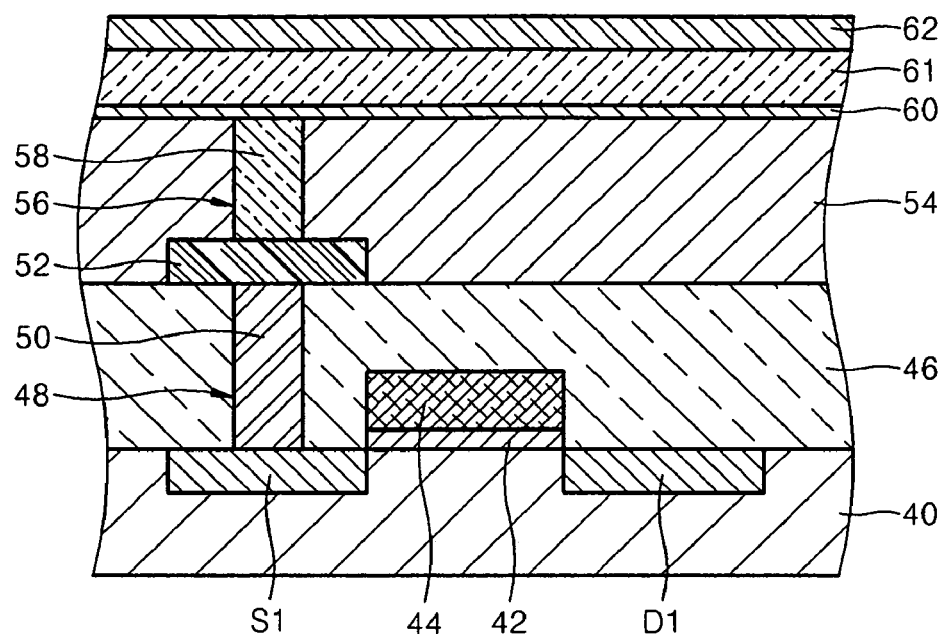
Figure 6F:
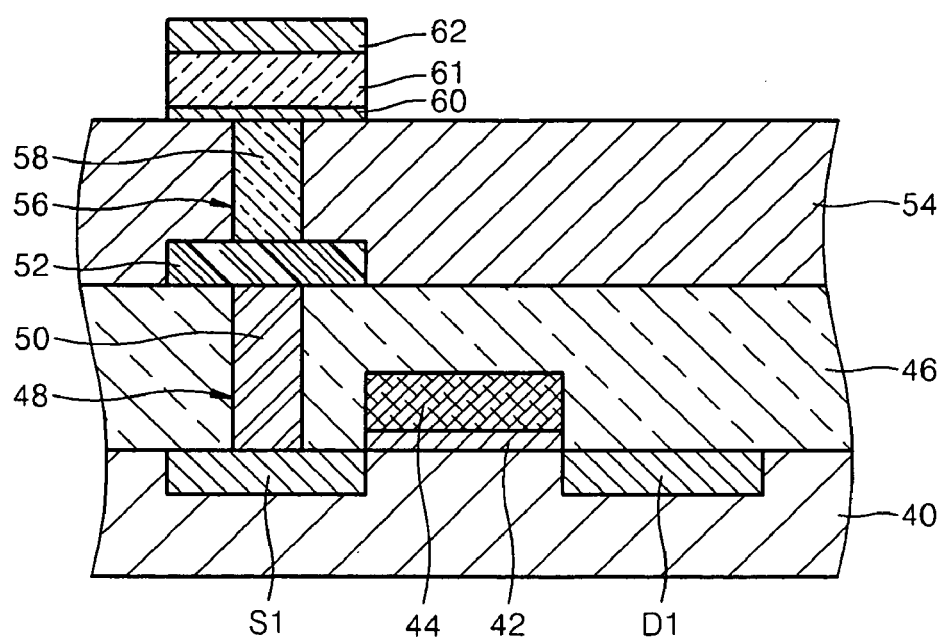

As shown in FIG. 6D, a phase change layer 61 may be formed on the fullerene layer 60. A component material and a formation method of the phase change layer 61 may employ well known materials and methods. For example, the phase change layer 61 may be composed of GST and may be formed using a sputtering method. A target including a component of the GST, for example, GeTe, and a target including another component of the GST, for example, $Sb_2Te_3$, may be prepared. A sputtering gas may be made to collide with the two targets so that the materials of the two targets are uniformly mixed and the phase change layer 61 may be formed as a thin film on the fullerene layer 60. As shown in FIG. 6E, an upper electrode 62 may be formed on the phase change layer 61, and as shown in FIG. 6F, the upper electrode 62, the phase change layer 61 and the fullerene layer 60 may be patterned, so as to form a storage node of desired size in the region including an upper surface of the bottom electrode contact plug 58. The patterning method for the storage node may not be limited to the above method.

Figure 7:
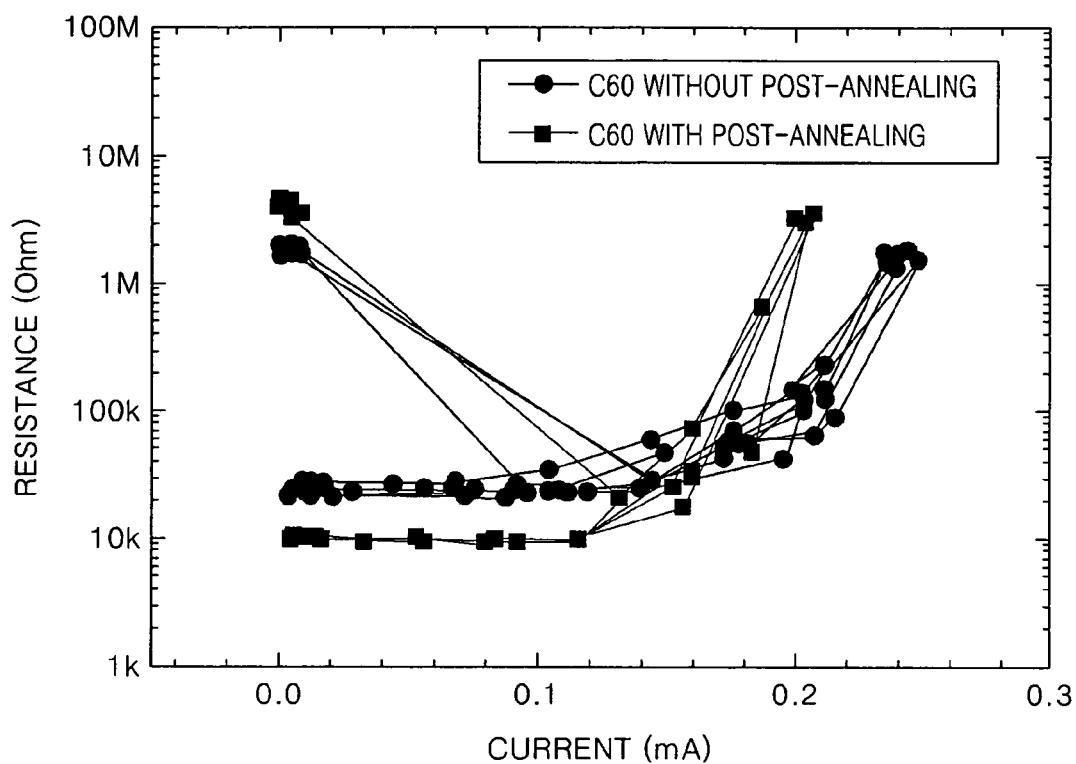

FIG. 7 illustrates plots of electrical characteristics of the PRAM in accordance with the annealing process after the fullerene layer may be formed. The plots of FIG. 7 may be made by applying current pulses corresponding to the values on the horizontal axis to the phase change layer 61 of the PRAM according to example embodiments, in order to measure resistances, and indicate the measured resistance values on the vertical axis, when the phase change layer 61 is initially in a set state (crystal state) and a reset state (amorphous state). The mark -●- may represent the annealing process that may be omitted after the fullerene layer 60 may be formed, and the mark -■- may represent the annealing process that may be performed after the fullerene layer 60 may be formed.

From the plots of FIG. 7, it may be determined that a resistance value in a reset state may be relatively high and a resistance value in a set state may be relatively low. A reset current may be low when annealing the fullerene layer 60 compared to omitting the annealing process.

The reset current may decrease as much as about 0.05 mA compared to where the annealing process is not performed. Relatively high integration of the PRAM may be accomplished. The resistance value in the set state may decrease as much as about 10 kΩ compared to where the annealing process is not performed. The PRAM may operate more easily and the accuracy of reading data may be improved by increasing a resistance ratio of the set state and the reset state.

In the method of fabricating the PRAM having the fullerene layer according to example embodiments, the PRAM having the fullerene layer between the bottom electrode and the phase change layer may be fabricated effectively. The method of fabricating the PRAM having the fullerene layer according to example embodiments may improve electrical characteristics (e.g., decreasing a reset current in the PRAM) and a resistance value in a set state, and may also improve the alignment state of the fullerene layer.

While example embodiments have been particularly shown and described with reference to example embodiments thereof, it will be understood by those of ordinary skill in the art that various changes in form and details may be made therein without departing from the spirit and scope of the following claims.

What is claimed is:

1. A method of fabricating a phase change RAM (PRAM) comprising:
   forming a bottom electrode, forming an interlayer dielectric film covering the bottom electrode, and forming a bottom electrode contact hole exposing a portion of the bottom electrode in the interlayer dielectric film;
   forming a bottom electrode contact plug by filling the bottom electrode contact hole with a plug material;
   forming a fullerene layer on a region including at least an upper surface of the bottom electrode contact plug; and
   sequentially stacking a phase change layer and an upper electrode on the fullerene layer,
      wherein the fullerene layer contacts the bottom electrode contact plug.

2. The method of claim 1, wherein a fullerene forming the fullerene layer is at least one selected from a group consisting of $C_{60}$, $C_{70}$, $C_{76}$, $C_{78}$, $C_{82}$ and $C_{84}$.

3. The method of claim 1, wherein a fullerene forming the fullerene layer is a metal endohedral including a metal atom therein.

4. The method of claim 3, wherein the metal atom is one selected from a group consisting of La, Er, Gd, Ho and Nd.

5. The method of claim 1, wherein forming the bottom electrode contact plug and forming the fullerene layer includes filling the plug material so that the upper surface of the bottom electrode contact plug and an upper surface of the interlayer dielectric film are planarized, and the fullerene layer is formed thereon.

6. The method of claim 1, wherein forming the bottom electrode contact plug and forming the fullerene layer includes filling the plug material so that a height of the bottom electrode contact plug is lower than an upper surface of the interlayer dielectric film, and the fullerene layer is formed in a portion of the contact hole.

7. The method of claim 1, wherein forming the fullerene layer includes forming the fullerene layer to a thickness of 1 monolayer to about 100 monolayers.

8. The method of claim 7, wherein forming the fullerene layer includes forming the fullerene layer to the thickness of 1 monolayer to about 10 monolayers.

9. The method of claim 1, further comprising:
   forming a switching device on a substrate and wherein the bottom electrode is connected to the switching device.

10. The method of claim 1, wherein forming the fullerene layer includes forming the fullerene layer using a vacuum deposition method.

11. The method of claim 10, wherein while performing the vacuum deposition during forming of the fullerene layer, heating the substrate.

12. The method of claim 11, wherein heating the substrate includes heating to a temperature in a range of about 100° C. to about 400° C.

13. The method of claim 10, wherein before forming the phase change layer, annealing the substrate having the fullerene layer formed thereon.

14. The method of claim 13, wherein an annealing temperature is in a range of about 100° C. to about 350° C.

15. The method of claim 13, wherein the annealing the substrate includes performing the annealing in an atmosphere of a vacuum, inert gas, or nitrogen gas.

16. The method of claim 15, wherein annealing the substrate includes performing the annealing in the atmosphere, wherein the atmosphere further includes $H_2$ or $NH_3$ gas.

17. The method of claim 1, wherein forming the fullerene layer includes performing a coating method using a solution including fullerenes.

18. The method of claim 17, wherein before forming the phase change layer, annealing the substrate having the fullerene layer formed thereon.

19. The method of claim 18, wherein an annealing temperature is in a range of about 100° C. to about 350° C.

20. The method of claim 18, wherein annealing the substrate includes performing the annealing in an atmosphere of a vacuum, inert gas, or nitrogen gas.

21. The method of claim 20, wherein annealing the substrate includes performing the annealing in the atmosphere, wherein the atmosphere further includes $H_2$ or $NH_3$ gas.

22. The method of claim 17, wherein performing the coating method includes employing spin coating using the solution including fullerenes.

23. The method of claim 22, wherein a solvent of the solution is one selected from a group consisting of 1,2,4-trichlorobenzene, carbon disulfide, toluene, benzene, chloroform, carbon tetrachloride, cyclohexane, n-hexane, THF, acetonitrile, and methanol.

* * * * *